United States Patent [19]
Westwick et al.

[11] Patent Number: 4,782,305
[45] Date of Patent: Nov. 1, 1988

[54] DIFFERENTIAL INPUT-SINGLE OUTPUT TWO POLE FILTER IMPLEMENTED BY A SINGLE AMPLIFIER

[75] Inventors: Alan L. Westwick; Carlos A. Greaves, both of Austin, Tex.

[73] Assignee: Motorola, Inc., Schaumburg, Ill.

[21] Appl. No.: 104,008

[22] Filed: Oct. 2, 1987

[51] Int. Cl.[4] .............................................. H03F 1/34
[52] U.S. Cl. .................................. 330/107; 330/294; 330/306
[58] Field of Search ............... 330/107, 260, 294, 303, 330/304, 302, 306; 333/172; 307/520

[56] References Cited

U.S. PATENT DOCUMENTS 3,939,468 2/1976 Mastin ............................... 367/65 X
4,241,428 12/1980 Berni et al. ...................... 330/258 X
4,242,741 12/1980 Parrish ............................. 330/258 X
4,588,956 5/1986 de Corlieu et al. ............. 330/302 X Primary Examiner—James B. Mullins
Attorney, Agent, or Firm—John A. Fisher; Jeffrey Van Myers; Robert L. King

[57] ABSTRACT

An analog two pole filter is provided which uses a single amplifier to implement a predetermined transfer function. The filter has a differential input and converts the two inputs to a single output utilizing the same amplifier which performs the filtering function. By coupling a capacitor across the differential input and utilizing the differential aspect of the input signals, the capacitor may be implemented with half the capacitance otherwise required to implement the predetermined transfer function, thereby minimizing circuit area.

8 Claims, 1 Drawing Sheet

DIFFERENTIAL INPUT-SINGLE OUTPUT TWO POLE FILTER IMPLEMENTED BY A SINGLE AMPLIFIER

TECHNICAL FIELD

This invention relates to electronic amplifiers, and more particularly, to filter circuits which receive differential input signals and provide a single output signal.

BACKGROUND ART

Multiple pole filters are desirable over single pole filters because the passband frequency typically remains linear over a wider frequency range and the attenuation at an upper frequency cutoff value is much sharper and distinct for multiple pole filters than single pole filters. Therefore, two pole filters are typically implemented. Also, two pole filters operate in a predictable, well-defined manner. A two pole filter may be implemented with an operational amplifier which receives a single input signal to be filtered.

Analog circuitry may be implemented with differential signals to improve accuracy and circuit performance. When differential signals exist, noise contributions and other errors which are coupled into the signals are cancelled by the balanced nature of the differential signals. When a single signal is used, noise contributions may create significant circuit performance degradation. Use of differential signals is particularly advantageous when low power supply voltages such as five volts or less are used. However, single signal outputs are typically required at the output of most circuits. Therefore, conversions from fully differential signals to a single signal must be made. Such conversions are typically implemented by an operational amplifier. An example of an operational amplifier circuit which converts fully differential inputs to a single ended output amplifier is taught in the copending patent application Ser. No. 07/003,173, now U.S. Pat. No. 4,720,686, and assigned to the assignee hereof. Others who have implemented a filter circuit having differential input signals have typically utilized at least two operational amplifier circuits to do so wherein one operational amplifier converts the differential signals to a single signal and the second operational amplifier performs a filtering function. Such circuits typically require a large amount of circuitry and power to perform both functions. Two pole filter circuits may also require the use of very large capacitor values and resistor values. When nonlinear resistors are implemented, significant harmonic distortion may be introduced into the signal path.

BRIEF DESCRIPTION OF THE INVENTION

Accordingly, an object of the present invention is to provide an improved differential input-single output two pole filter circuit.

Another object of the present invention is to provide an improved filter circuit for receiving differential input signals and providing a single output signal which minimizes circuit area required to implement.

Yet another object of this invention is to provide an improved method for implementing a filter circuit which receives two input signals and provides a single output signal.

A further object of the present invention is to provide an improved method for minimizing capacitive circuit component values in a filter circuit.

In carrying out the above and other objects of the present invention, there is provided, in one form, a filter circuit which receives two input signals. The filter circuit implements a predetermined transfer function to provide a single output signal. A differential amplifier is used having first and second inputs and an output for providing the output signal. A first circuit portion is coupled to the differential amplifier for receiving a first of the two input signals. The first circuit portion implements, in part, the predetermined transfer function. A second circuit portion further implements the predetermined transfer function. The second circuit portion is coupled to the differential amplifier and receives a second of the two input signals. A capacitor is coupled between the first and second circuit portions and to the input signals for further implementing the predetermined transfer function. The capacitor utilizes a differential voltage between the two input signals which reduces the capacitive value required to implement the predetermined transfer function.

These and other objects, features and advantages will be more clearly understood from the following detailed description taken in conjunction with the accompanying drawings.

DETAILED DESCRIPTION OF THE INVENTION

Figure 1:
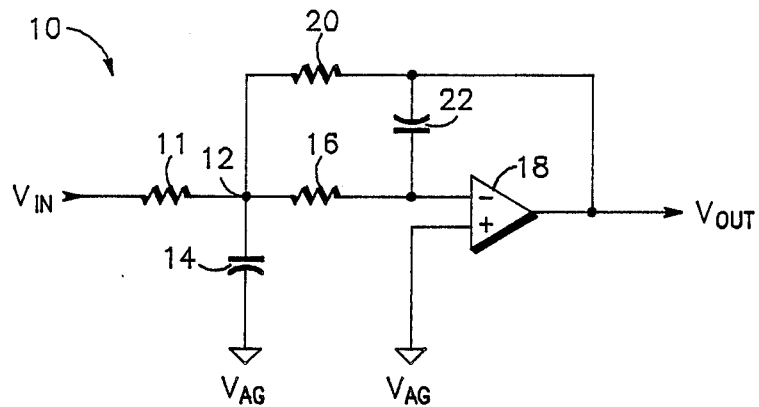
FIG. 1 illustrates in partial schematic form a single input filter circuit known in the art.

Shown in FIG. 1 is a conventional filter circuit 10 for receiving a single input signal $V_{IN}$. A resistor 11 has a first terminal connected to the input voltage $V_{IN}$ and a second terminal connected to a node 12. A capacitor 14 has a first electrode connected to node 12 and a second electrode connected to a reference voltage terminal for receiving an analog ground reference voltage labeled "$V_{AG}$". A resistor 16 has a first terminal connected to node 12 and a second terminal connected to an inverting input of an operational amplifier 18. A resistor 20 has a first terminal connected to node 12 and has a second terminal connected to an output of operational amplifier 18. A capacitor 22 has a first electrode connected to the inverting input of operational amplifier 18 and has a second electrode connected to the output of operational amplifier 18.

In operation, the single input voltage which is coupled to the first terminal of resistor 11 is coupled to the inverting input of operational amplifier 18 via resistors 11, and 16. It may readily be shown that the voltage gain $V_G$ of filter circuit 10, $(V_{Out})/(V_{In})$, may be expressed in the s domain as:

$$(A)(b_0)/(s^2 + b_1 s + b_0) \qquad (1)$$

where:

$$b_0 = (1)/[(R20)(R16)(C14)(C22)],$$

wherein R20 and R16 are the resistive values of resistors 20 and 16, respectively, and C14 and C22 are the capacitive values of capacitors 14 and 22, respectively. Typically, the capacitive value of capacitor 14 is substantially larger than the capacitive value of capacitor 22 resulting in a large size required to implement capacitor 14. In equation one above, the expression $b_1$ may be defined as:

$$b_1 = (1/C14)[(1/R11) + (1/R20) + (1/R16)],$$

wherein R11 is the resistive value of resistor 11. The term "A" in equation one is the D.C. gain of filter circuit 10 and is equal to (−R20/R11). The D.C. gain is therefore determined by a single resistive ratio and may be made very stable when implemented with conventional resistors. Because of the existence of a ratio, processing and temperature variations inherent in resistors 11 and 20 cancel so that the D.C. gain of filter circuit 10 remains constant. Therefore, in the passband frequencies, filter circuit 10 provides a stable and accurate output signal with predetermined amplification. However, filter circuit 10 is capable of only receiving a single input signal. In analog systems where a differential signal exists, a conversion from the differential signals to a single signal must be made before filter circuit 10 may be used.

Figure 2:
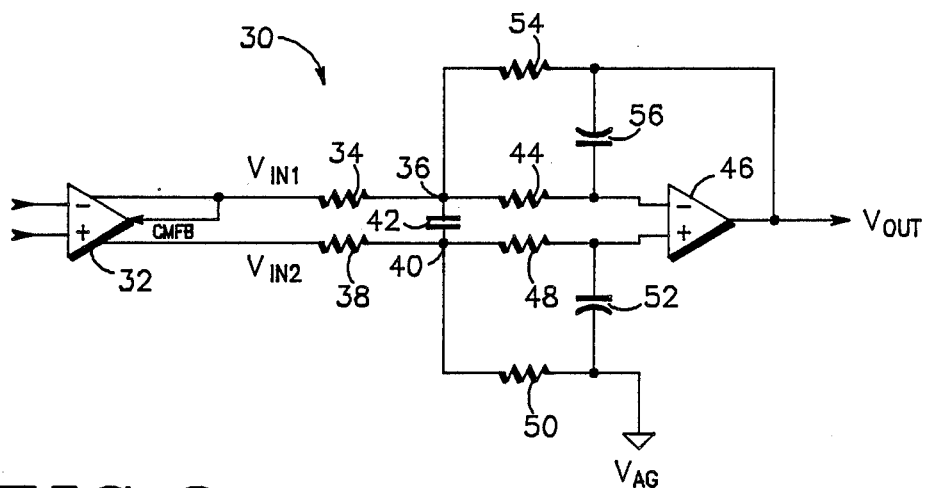
FIG. 2 illustrates in partial schematic form a differential to single ended filter circuit in accordance with the present invention.

Shown in FIG. 2 is a differential input-single output two pole filter circuit 30. A fully differential amplifier 32 is connected to filter circuit 30. Fully differential amplifier 32 has first and second inputs for receiving first and second input signals, not labeled. Fully differential amplifier 32 also has first and second outputs which respectively provide first and second input voltages, $V_{IN1}$ and $V_{IN2}$. A first output of fully differential amplifier 32 is connected to a first terminal of a resistor 34. The first output of fully differential amplifier 32 is also connected to a common-mode feedback terminal for providing a common-mode feedback signal labeled "CMFB". A second terminal of a resistor 34 is connected to a node 36. The second output of fully differential amplifier 32 is connected to a first terminal of a resistor 38. A second terminal of resistor 38 is connected to a node 40. A first electrode of a capacitor 42 is connected to node 36, and a second electrode of capacitor 42 is connected to node 40. A first terminal of a resistor 44 is connected to node 36, and a second terminal of resistor 44 is connected to an inverting input of an operational amplifier 46. A first terminal of a resistor 48 is connected to node 40, and a second terminal of resistor 48 is connected to a noninverting input of operational amplifier 46. A first terminal of a resistor 50 is connected to node 40, and a second terminal of resistor 50 is connected to a reference voltage terminal for receiving an analog ground reference voltage $V_{AG}$. A first electrode of a capacitor 52 is connected to the noninverting input of operational amplifier 46, and a second electrode of capacitor 52 is connected to the reference voltage terminal for receiving analog ground. A first terminal of a resistor 54 is connected to node 36, and a second terminal of resistor 54 is connected to an output terminal of operational amplifier 46 for providing an output voltage $V_{OUT}$. A first electrode of a capacitor 56 is connected to the second terminal of resistor 54, and a second electrode of capacitor 56 is connected to the inverting input of operational amplifier 46. For purposes of illustration, assume that filter circuit 30 is implemented with resistors 34 and 38 having equal values, resistors 54 and 50 having equal values, resistors 44 and 48 having equal values, and capacitors 52 and 56 having equal values for a balanced mode of operation. When active components are implemented having equal values and integer ratios thereof, more accurate values are generally manufacturable.

In operation, fully differential amplifier 32 with output common-mode voltage feedback may be implemented by the amplifier taught in U.S. Pat. No. 4,720,686 which is herein incorporated by reference. The common-mode output voltage feedback of fully differential amplifier 32 only provides power supply rejection within the bandwidth of fully differential amplifier 32. More importantly, good power supply rejection is provided by fully differential amplifier 32 only around a D.C. frequency. Therefore, filter circuit 30 must provide power supply rejection for signals within and above the passband frequency range of fully differential amplifier 32. Filter circuit 30 may be implemented with nonlinear resistors and still provide excellent power supply rejection because one of the outputs of fully differential amplifier 32 as disclosed in U.S. Pat. No. 4,720,686 is connected to a common-mode reference voltage terminal. The common-mode feedback connection of fully differential amplifier 32 essentially configures the output of amplifier 32 as a single-ended output although two outputs are provided. For passband frequencies, the first terminal of resistor 34 is essentially clamped at the predetermined common-mode output voltage. However, filter circuit 30 is a balanced fully differential structure which cancels errors associated with nonlinear resistors within the bandwidth of fully differential amplifier 32 and which can reject power supply noise at high frequencies above the bandwidth range of fully differential amplifier 32.

Filter circuit 30 provides a two pole filtering function with a relatively flat passband frequency. Attenuation at a predetermined cutoff frequency is very sharp and distinct for filter circuit 30. It can readily be shown that the gain transfer function for filter circuit 30 may be represented as:

$$V_{OUT} = (Vin1 - Vin2)[(A)(b0)/(s^2 + b1s + b0)] \qquad (2)$$

where:

$$b0 = (1)/[(R54)(R44)(2)(C42)(C56)],$$

wherein R54 and R44 are the resistive values of resistors 54 and 44, respectively, and C42 and C56 are the capacitive values of capacitors 42 and 56, respectively. In equation two, the expression "b1" may be defined as:

$$b1 = [1/(2)(C42)][(1/R34) + (1/R54) + (1/R44)],$$

wherein R34 is the resistive value of resistor 34. The term "A" in equation two is the D.C. gain of filter 30 and is equal to (−R54/R34). The D.C. gain is again determined by a single resistive ratio and may be made very stable when implemented with conventional resistors. Filter circuit 30 combines the characteristics of filter circuit 10 of FIG. 1 with a conversion of two input signals to a single output signal. An additional amplifier is not required in order to accomplish the additional functions and a significant increase in circuitry has been avoided.

As illustrated in FIG. 2, the shared use of capacitor 42 between the two signals conducted by resistors 34 and 38 allows a significant reduction in the capacitive value of capacitor 42 required to satisfy equation two. Each electrode of capacitor 42 is driven by one of the differential signals wherein each signal is equal but of opposite polarity to the other signal. Therefore, the amount of voltage applied across capacitor 42 is twice the amount applied if only a single signal is coupled to capacitor 42. As a result, only one-half as much capacitance is required to implement capacitor 42 to realize the same filtering effect as is required of capacitor 14 of filter circuit 10 in the single input example of FIG. 1. The significance of this statement is related to the fact that capacitor 14 is often significantly larger than capacitor 22 due to the transfer equation and capacitor 14 required a substantial amount of circuit area to implement. Since capacitor 42 of filter circuit 30 is substantially one-half the capacitive value of capacitor 14 of filter circuit 10 in order to obtain the same filtering effect, the total capacitance required by filter circuit 30 may be less than the capacitance required by filter circuit 10.

By now it should be apparent that a two pole filter circuit which uses a single amplifier and which can convert two input signals to a single output signal has been provided. The present invention utilizes passive components to implement the filtering and combines multiple functions in a single amplifier structure while minimizing circuit area required to implement the passive circuit components. The present invention further embodies a method of minimizing capacitive element size required to implement a predetermined transfer function in a filter. The filter taught herein provides a clean, continuous-time, single-ended filtered output signal.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A filter circuit for receiving first and second input signals and providing a single output signal comprising:
   a first resistor having a first terminal for receiving the first input signal, and a second terminal;
   a second resistor having a first terminal for receiving the second input signal, and a second terminal;
   first capacitance means having a first electrode coupled to the second terminal of the first resistor, and a second electrode coupled to the second terminal of the second resistor;
   a third resistor having a first terminal coupled to the second terminal of the first resistor, and a second terminal;
   a fourth resistor having a first terminal coupled to the second terminal of the second resistor, and a second terminal;
   an operational amplifier having a first input coupled to the second terminal of the third resistor, a second input coupled to the second terminal of the fourth resistor, and an output for providing the single output signal;
   a fifth resistor having a first terminal coupled to the second terminal of the second resistor, and a second terminal coupled to a reference voltage terminal;
   second capacitance means having a first electrode coupled to the second terminal of the fourth resistor, and a second electrode coupled to the reference voltage terminal;
   a sixth resistor having a first terminal coupled to the second terminal of the first resistor, and a second terminal; and
   third capacitance means having a first electrode coupled to both the second terminal of the sixth resistor and the output of the operational amplifier, and a second electrode coupled to the first input of the operational amplifier.

2. The filter circuit of claim 1 wherein the first input of the operational amplifier is an inverting input and the second input of the operational amplifier is a noninverting input.

3. The filter circuit of claim 1 wherein the first and second resistors have substantially equal resistances, the third and fourth resistors have substantially equal resistances, and the fifth and sixth resistors have substantially equal resistances.

4. The filter circuit of claim 1 wherein the second and third capacitance means have substantially equal capacitive values.

5. A method of minimizing capacitive circuit component values in a filter circuit which implements a predetermined transfer function and receives differential input signals, comprising the steps of:
   providing a single differential amplifier;
   coupling a first of the differential input signals to an inverting input of the differential amplifier, said first differential input signal being attenuated in accordance with the predetermined transfer function by a first circuit portion, said first circuit portion comprising first and second series connected resistors coupled between the first differential input signal and the inverting input, a first capacitance coupled between the inverting input and an output of the differential amplifier, and a third resistor connected between the output of the differential amplifier and a node connecting the first and second resistors;
   coupling a second of the differential input signals to a noninverting input of the differential amplifier, said second differential input signal being attenuated in accordance with the predetermined transfer function by a second circuit portion, said second circuit portion comprising fourth and fifth resistors connected in series and coupled between the second differential input signal and the noninverting input, a second capacitance coupled between the noninverting input and a reference voltage terminal, and a sixth resistor connected between the reference voltage terminal and a node connecting the fourth and fifth resistors; and
   sharing a third capacitance between the first and second circuit portions to implement the predetermined transfer function, said third capacitance being coupled to the differential input signals and using a differential between the input signal to minimize capacitive value required to implement the predetermined transfer function.

6. A filter circuit which receives differential input signals and implements a predetermined transfer function to provide a single output signal, comprising:
   a differential amplifier having first and second inputs, and an output for providing the output signal;
   first circuit means coupled to the differential amplifier for receiving a first of the differential input signals, said first circuit means implementing in part the predetermined transfer function and comprising:

a first resistor having a first terminal for receiving the first of the differential input signals, and having a second terminal;

second resistor having a first terminal coupled to the second terminal of the first resistor, and having a second terminal coupled to the output of the differential amplifier;

a third resistor having a first terminal coupled to the second terminal of the first resistor, and having a second terminal coupled to the first input of the differential amplifier; and first capacitance means having a first electrode coupled to the first input of the differential amplifier, and having a second electrode coupled to the output of the differential amplifier;

second circuit means coupled to the differential amplifier for receiving a second of the differential input signals, said second circuit means further implementing the predetermined transfer function; and second capacitance means coupled between the first and second circuit means and to the differential input signals for further implementing the predetermined transfer function, said second capacitance means utilizing a differential voltage between the differential input signals when further implementing the predetermined transfer function.

7. The filter circuit of claim 6 wherein said second circuit means further comprises:

a first fourth resistor having a first terminal for receiving the second of the differential input signals, and having a second terminal;

a fifth resistor having a first terminal coupled to the second terminal of the fourth resistor, and having a second terminal coupled to a reference voltage terminal;

a sixth resistor having a first terminal coupled to the second terminal of the fourth resistor, and having a second terminal coupled to the second input of the differential amplifier; and third capacitance means having a first electrode coupled to the second input of the differential amplifier, and having a second electrode coupled to the reference voltage terminal.

8. The filter circuit of claim 7 wherein the first input of the differential amplifier is an inverting input, and the second input of the differential amplifier is a noninverting input.

* * * * *